(12) United States Patent
Bolde et al.

(10) Patent No.: US 6,360,940 B1
(45) Date of Patent: Mar. 26, 2002

(54) METHOD AND APPARATUS FOR REMOVING KNOWN GOOD DIE (75) Inventors: Lannie R. Bolde, New Paltz; James Hennekens, Marlboro; Gregory M. Johnson, Poughkeepsie; David Olson, LaGrangeville, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/709,092

(22) Filed: Nov. 8, 2000

(51) Int. Cl.⁷ .............................................. B23K 1/018
(52) U.S. Cl. ........................ 228/264; 228/20.1; 228/53
(58) Field of Search .............................. 228/119, 234.1, 228/264, 180.22, 201, 53, 19

(56) References Cited

U.S. PATENT DOCUMENTS

| | | | |
|---|---|---|---|
| 4,767,047 A | * | 8/1988 | Todd et al. |
| 4,858,820 A | * | 8/1989 | Kent |
| 4,979,287 A | | 12/1990 | Schwab et al. |
| 5,154,793 A | * | 10/1992 | Wojnarowski et al. |
| 5,553,766 A | | 9/1996 | Jackson et al. |
| 5,605,277 A | | 2/1997 | Jackson et al. |
| 5,636,781 A | | 6/1997 | Olson et al. |
| 5,707,000 A | | 1/1998 | Olson et al. |
| 5,738,267 A | | 4/1998 | Olson et al. |
| 5,758,817 A | * | 6/1998 | Chapman |
| 5,779,133 A | | 7/1998 | Jackson et al. |
| 5,782,403 A | | 7/1998 | Wang |
| 5,785,237 A | * | 7/1998 | Lasto et al. |
| 5,862,588 A | * | 1/1999 | Heim et al. |
| 6,059,170 A | * | 5/2000 | Jimarez et al. |
| 6,163,014 A | * | 12/2000 | Bergeron et al. |
| 6,182,884 B1 | * | 2/2001 | Ma et al. |
| 6,257,478 B1 | * | 7/2001 | Straub |

* cited by examiner

Primary Examiner—Tom Dunn
Assistant Examiner—Jonathan Johnson
(74) Attorney, Agent, or Firm—Ratner & Prestia; Tiffany L. Townsend, Esq.

(57) ABSTRACT

Preferred embodiments for methods of removing an integrated circuit ("IC") from a substrate, where the IC is attached to the substrate by multiple solder connections are disclosed. One preferred embodiment of the inventive methods provides the steps of heating the IC and substrate to the reflow temperature for the solder connections and pulling the IC from the substrate by means of a vacuum force. Another preferred embodiment of the inventive method provides the step of shearing the IC from the substrate after the substrate and IC are heated, but before solder reflow temperature has been reached, and where the shearing force may be programmed through a computer controlled servomotor. Preferred embodiments of certain apparatus applying the inventive methods for removing an integrated circuit from a substrate are also disclosed. One preferred embodiment of the inventive apparatus includes a vented pallet to hold the substrate and IC and through which the vacuum force is applied to pull the IC from the substrate without the use of physical clamping or contact forces applied to the substrate or IC. In a further preferred embodiment of the inventive apparatus, shear elements are provided and used with a programmable servomotor for precisely controlling the forces applied to the substrate and IC as a function of time, temperature and translational distance.

14 Claims, 9 Drawing Sheets

METHOD AND APPARATUS FOR REMOVING KNOWN GOOD DIE

TECHNICAL FIELD

This invention generally relates to the testing of integrated circuits ("IC") including a method for removing and an apparatus that removes ICs or chips from a substrate after the chip has been tested on the substrate. More particularly, this invention relates to temporary chip attach ("TCA") technologies in which chips are mounted to a substrate carrier for functional performance testing through the substrate and then the removal of those chips from the substrate for further use if the chip passes the functional testing. In certain embodiments, the present inventive methods and apparatus can remove the chip from the substrate without physical or mechanical contact of a shearing device or clamp with the chip thereby reducing damage that may be caused to the chip during or after the functional performance testing. In other embodiments, the present inventive methods and apparatus remove the chip from the substrate through use of a computer controlled servomotor to precisely regulate the shearing forces used to remove the chip.

BACKGROUND OF INVENTION

The demand for additional intricacy of integrated circuits has imposed an increase in the design complexity of IC. Indeed, ICs today are often manufactured in stages having multiple levels of circuitry and electronic components. As the intricacy and complexity of ICs increase, the need to test the IC to ensure functional performance prior to final installation has become more significant and critical. Indeed, there is a critical demand to be able to test and assess electronic components prior to final use.

To satisfy this need for the testing of ICs, temporary chip attach ("TCA") technologies have been developed in which ICs or chips are attached to a temporary substrate carrier for testing of the IC prior to final installation on the final substrate. The typical TCA mechanism uses solder connection points or solder bumps on the chip, known as C4s (controlled collapsed chip connector), to attach the chip to the substrate. With the chip attached to the substrate, it may then be run through functional performance testing while attached to the substrate. Following the testing, the chip may be removed from the substrate for future use. Because the substrate carrier has reduced pad diameters to which the solder bumps attach, when the chip is removed from the substrate, the C4s remain on the chip and may be reused to attach the chip to the final substrate. The technology of testing and removing a chip from a substrate is generally referred to as "known good die" removal.

Various methods and devices have been developed to remove a chip from a substrate. The methods and devices generally can be characterized as a "cold chip" or "cold shear," "warm shear," or a "hot vacuum" or "hot vac" removal process. The cold shear devices remove the chip from the substrate by applying shear forces to the chip and substrate with the components being at room temperature. The warm shear devices similarly remove the chip by applying shear forces to the chip and substrate, but the temperature of the components, including the C4s are raised above room temperature. Finally, the hot vac removal methods may or may not use shear forces to remove the chip, but in either method, the temperature of the components is raised to soften the C4s. In the hot vac removal methods, the temperature of the C4s is raised a reflow state. In most known methods of cold and warm shear removal, the devices use preloaded springs or other forces to shear the chip away from the substrate.

One significant problem with the cold and warm shear removal devices is that such systems require that the substrate and/or the chip be physically clamped, or as noted with the use of preloaded springs, the substrate and chip are mechanically separated from each other. The clamping of the chip or substrate, and the mechanical contact of shear devices with the chip and substrate often causes damage to these components. Such damage can destroy the chip. Even if the clamping or contact with the shear device does not damage the chip, due to the spring action, once the chip separates from the substrate, it may be thrown against adjacent components on the substrate, which again could cause damage to the chip or to the adjacent component. While a cushioning tape may be applied to the adjacent components to protect the chip and components, such a solution is very time consuming for the operator and does not reliably prevent damage to the chip or other components attached to the substrate.

Three examples of current devices for removing electronic devices or components from substrates are U.S. Pat. Nos. 5,779,133 and 5,553,766, both by Jackson et al. disclosing an In-Situ Device Removal For Multichip Modules, and U.S. Pat. No. 5,605,277 by Jackson et al. teaching a Hot Vacuum Device Removal Process and Apparatus. The '133 and '766 Jackson et al. patents and the '277 Jackson et al. patent are all assigned to the Applicant.

The '133 and '766 Jackson et al. patents generally teach an apparatus that can remove a semiconductor chip forma substrate using a chip lifting assembly that comprises means for gripping the chip, means for applying a lifting force after the chip has reached a temperature where the solder is softened. The lifting force means includes a disk shaped element that is deformable at the same temperatures where the solder is softened. The object of the '133 and '766 Jackson et al. patents is to repeatably remove chips from a substrate using reduced temperatures and forces, as compared to other hot shear or cold shear removal methods. By reducing forces required to separate the chip from the substrate, potential damage to the chip is similarly reduced. Both of the apparatuses described in the 3 133 and '766 Jackson et al. patents specifically require a "chip gripping means" to remove or pry the chip from the substrate.

The '277 Jackson et al. patent discloses a warm shear method of removing electronic components from substrates in a nondestructive action. The method uses a box oven and vacuum system such that after the temperature of the components and solder is raised to a molten condition, a vacuum is applied to the electronic component to lift it away from the substrate. While the '277 Jackson et al. method and device described does not appear to use a clamp to hold or remove the electronic component, the method and device do specifically require a physical fixture, including in one embodiment, stainless steel springs, to secure and restrain the substrate when the vacuum is applied to remove the electronic component.

Similar to the Jackson et al. patents, U.S. Pat. Nos. 5,738,267; 5,707,000 and 5,636,781, all by Olson et al., each disclose an Apparatus And Method For Removing Known Good Die Using Hot Shear Process. In the '267; '000; and '781 patents, the apparatuses taught each use a removing means that is secured to the chip to be removed from the substrate, such that after the C4 points reach their reflow temperature, the removing means pulls the chip away from the substrate or device carrier. As described by Olson et al., the chip removal means is secured to or grasps the outer edges of the chip and applies a force or pull directly to the chip to separate it from the substrate. Upon raising the temperature of the solder connection points, the weight or pull of the chip removal means separates the chip from the substrate. As noted for the Jackson et al. methods and apparatuses, the three Olson et al. devices all require a mechanical clamping or grasping of the chip or substrate as part of the elements to remove the chip from the substrate. The forces imparted by the mechanical clamps or other removal means, being essentially uncontrolled, may damage the chip or substrate.

An example of a cold shear chip removal device is provided in U.S. Pat. No. 4,979,287 by Schwab et al., for a Tool For Semiconductor Chip Removal. The '287 patent discloses a device having several moveable members that respectively apply a bearing force to the chip to be removed and an exteriorly accessible surface of the chip carrier or substrate. By applying opposite forces to the chip and substrate as the moveable members are separated the chip is pried away from the substrate.

An alternative method of removing an IC from a substrate or carrier is taught by Wang in U.S Pat. No. 5,782,403 for an Ultrasonic Chip Removal Method and Apparatus. The disclosed method and apparatus uses lateral (side-to-side) ultrasonic vibration applied to the chip to remove the chip from the substrate. While the temperature of the solder connection points is not increased in the '403 device, the described embodiments all require that a "stud element" be affixed to the chip for imparting the ultrasonic vibration used to break the solder connections and thereby allow release of the chip. The '403 device also requires a "substrate holder" to securely lock the substrate to the device.

None of these methods and devices teach a way of removing an IC or chip from a substrate without using some form of a mechanical force applied to the chip or using a mechanical clamp element on the chip or substrate. In view of the need for and use of mechanical contact elements in all of the noted methods, they are all susceptible to the noted problem of causing damage to either the IC and/or the substrate during the process of removing the chip from the substrate.

Accordingly, there remains a need for a method and device to reliably, repeatedly and cost efficiently remove an IC from a substrate without the need for mechanical clamping or grasping elements which may cause damage to either the IC or the substrate. While some force is obviously required to remove the chip from the substrate, the preferred method and device should remove the IC from the substrate without the use of mechanical grasping or clamping, and alternatively if mechanical contact or forces are used, such forces should be accurately controlled to ensure that the minimum required force to remove the IC is used and that the IC and substrate are not damaged as a result of the removal process.

SUMMARY OF THE INVENTION

To overcome the shortcomings of the prior art, it is an object of the present invention to provide a method for and an apparatus that can remove an IC from a substrate to which the IC is attached by multiple solder connection points without causing damage to either the IC or the substrate.

To achieve this and other objects, and in view of its purposes, the present invention provides a method for removing an integrated circuit from a substrate, where the integrated circuit is attached to the substrate by a plurality of solder connection points, the method comprising the steps of (a) placing the substrate with the integrated circuit attached thereto in a carrier; (b) placing the carrier with the substrate with attached integrated circuit on a heating plate; (c) pulling the integrated circuit away from the substrate using fluidics after the solder connection points have reached reflow temperature; (d) removing the integrated circuit to a cooling plate; (e) removing the substrate from the heating plate; (f) placing another substrate with the integrated circuit attached thereto in a carrier; and (g) placing the carrier with the substrate and attached integrated circuit on the heating plate for removal of the integrated circuit from the substrate.

It is a further object of the present invention to provide a method for removing an integrated circuit from a substrate, where the integrated circuit is attached to the substrate by a plurality of solder connection points, the method comprising the steps of (a) placing the substrate with the integrated circuit attached thereto in a carrier; (b) placing the carrier with the substrate and integrated circuit attached thereto on a heating plate; (c) forcing the carrier with the substrate and attached integrated circuit to contact a shear element by a programmable motor after the solder connection points have been heated, thereby controllably separating the integrated circuit from the substrate; and (d) capturing the integrated circuit using fluidics as said integrated circuit separates from the substrate.

A further aspect of the present invention, is an apparatus for removing an integrated circuit from a substrate where the integrated circuit is attached to the substrate by a plurality of solder connection points, comprising a pallet having a cavity into which the substrate and integrated circuit fit, the pallet having a plurality of air channels formed in said pallet; a heating plate, onto which the pallet, substrate and integrated circuit are placed to increase the temperature of the plurality of solder connection points to a reflow temperature; and fluidic pulling means applied to the integrated circuit through the pallet plurality of air channels to remove the integrated circuit from the substrate after the plurality of solder connection points achieve a reflow temperature, the fluidic pulling means also maintaining the integrated circuit in the pallet cavity.

Another preferred embodiment of the present invention, is an apparatus for removing an integrated circuit from a substrate where the integrated circuit is attached to the substrate by a plurality of solder connection points, comprising a pallet having a cavity into which the substrate and integrated circuit fit, the pallet having a plurality of air channels formed in the pallet; a shear blade formed in the pallet restricting movement of the integrated circuit; a heating plate, onto which the pallet, substrate and integrated circuit are placed to increase the temperature of the plurality of solder connection points; a shear block restricting the movement of the substrate; a servo motor for moving the pallet, substrate and integrated circuit such that the substrate contacts the shear block after the plurality of solder connection points have been heated, thereby restricting movement of the substrate, the servo motor continuing to move the pallet and shear blade such that the shear blade contacts the integrated circuit and separates the integrated circuit from the substrate; and fluidic pulling means applied through the pallet plurality of air channels to capture the integrated circuit after the integrated circuit separates from the substrate.

It is to be understood that both the foregoing general description and the following detailed description are exemplary, and are not intended to be or should be considered restrictive of the invention.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of various features are arbitrarily expanded or reduced for clarity. Included in the drawings are the following figures.

DETAILED DESCRIPTION OF THE INVENTION

The invention will next be illustrated with reference to the figures in which the same numbers indicate the same elements in all figures. Such figures are intended to be illustrative, rather than limiting, and are included to facilitate the explanation of the process and structure of the present invention.

The present invention provides preferred methods and preferred embodiments of an apparatus for removing an integrated circuit ("IC"), chip or die from a substrate to which the IC is attached by at least one solder connection point. In one preferred embodiment of the inventive methods and apparatus, the IC is removed from the substrate without the use of any mechanical grasping or clamping of the IC or substrate. Instead of mechanically prying or shearing the IC from the substrate, the IC is removed through the use of fluidics or a vacuum. As described in further detail herein, the substrate with the IC attached is placed in a pallet or carrier dimensioned to hold the substrate and IC. The pallet, holding the substrate and IC, is heated to a temperature that reflows the C4 solder connection points. The pallet is formed with a plurality of internal vents and ports such that the application of a fluidics force or vacuum to the IC through the ports and vents creates a low pressure zone adjacent to the IC thereby pulling the IC away from the substrate without mechanical prying.

In another preferred embodiment of the inventive methods and apparatus, the IC is removed from the substrate using a combined hot shear/hot vac system, that allows for precise control of the applied shear force as a function of temperature or translational movement of the pallet and substrate against a shear element. The force control is accomplished by a computer controlled servomotor applying the shear force and a force transducer controlling the force input. Similar to the "hot vac" system, the combined "hot shear/hot vac" system uses a pallet or carrier to hold the substrate and IC, that is heated to soften the solder connection points. Prior to reaching solder reflow temperature, the pallet/substrate/IC unit is precisely translated towards a shear element, such that as the shear forces begin to separate the IC from the substrate, a vacuum is applied to the IC to pull the IC from the substrate and hold it in place within the pallet.

Figure 1A:
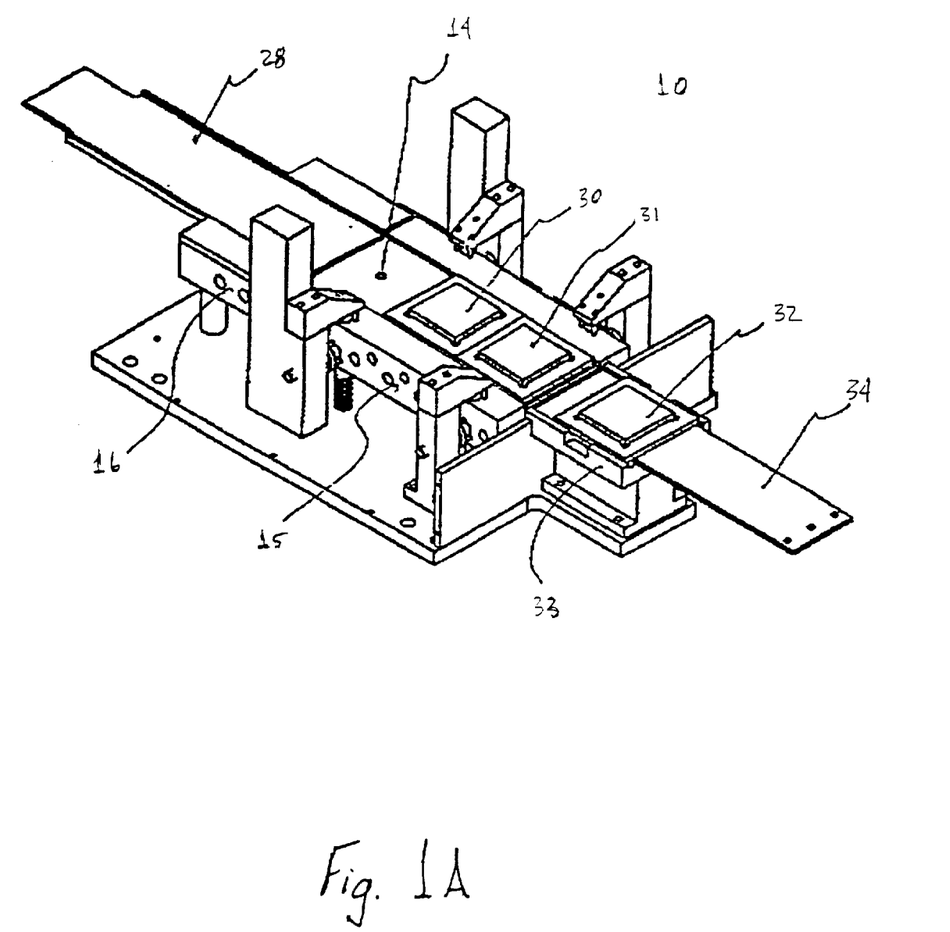
FIG. 1A shows an isometric view of an exemplary embodiment of the inventive apparatus for removing an integrated circuit from a substrate without a cover.
Figure 1B:
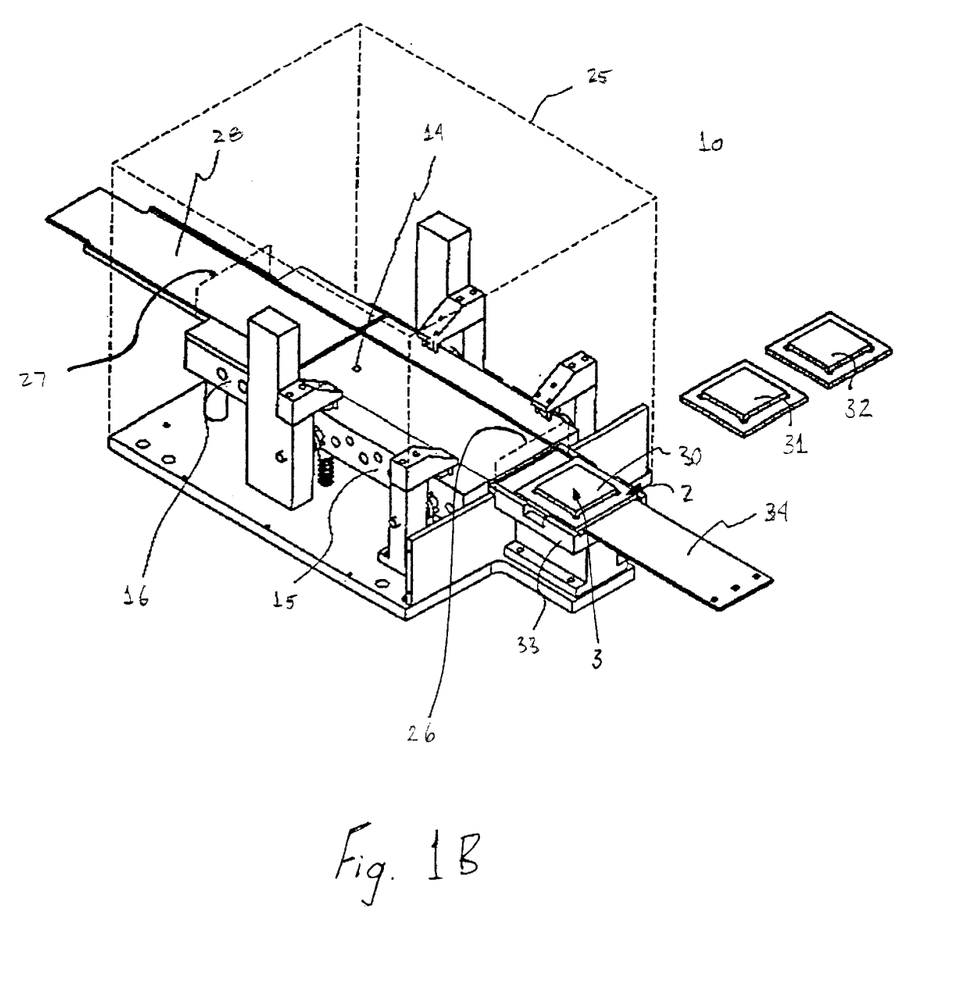
FIG. 1B shows an isometric view of an exemplary embodiment of the inventive apparatus for removing an integrated circuit from a substrate and showing, in a cut-away view, a cover for the inventive apparatus.
Figure 2:
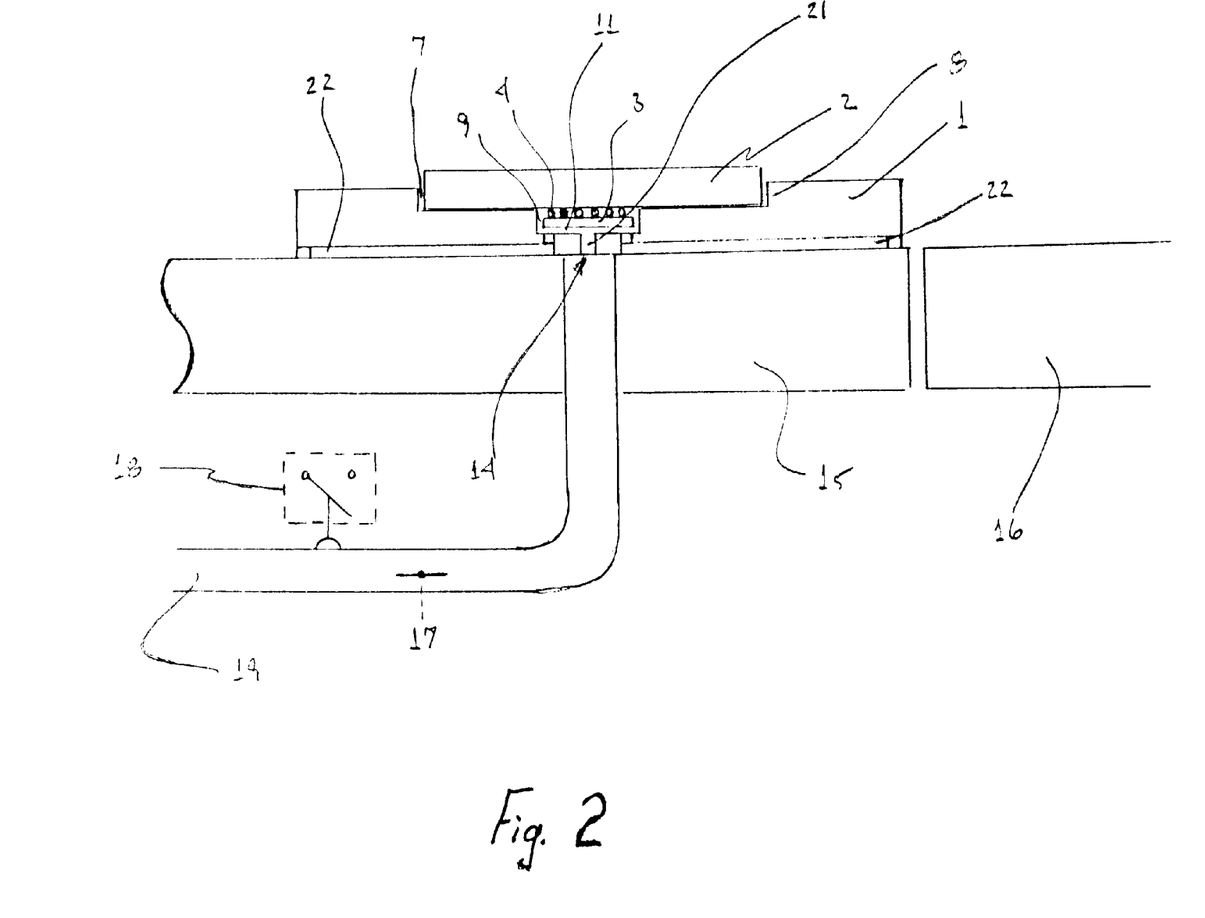
FIG. 2 shows a cut-away side view of an exemplary embodiment of the inventive apparatus for removing an integrated circuit from a substrate using a vacuum pulling force and a vented pallet for holding the substrate.

In more specific detail, FIGS. 1A, 1B and 2 illustrate a preferred embodiment of a "hot vac" apparatus 10 using the inventive method for removing an IC from a substrate. As shown in the FIG. 2 side view of the inventive apparatus 10, the substrate 2 and IC 3 are placed into a pallet 1. Significantly, substrate 2 and IC 3 are not clamped or secured within pallet 1.

Certain elements and features of pallet 1 are important to the present inventive IC removal method. More particularly, a cavity 7 is machined in pallet 1 and sized such that a substrate 2 and IC 3 fit into cavity 7. As shown in FIG. 2, a preferred embodiment of pallet 1 has both a substrate cutout 8 and a smaller IC cutout 9 such that substrate cutout 8 and IC cutout 9 comprise cavity 7. Moreover, in the preferred embodiment shown in FIG. 2, substrate 2 is placed in pallet 1 with IC 3 below the substrate. Although not shown in the attached figures, another preferred embodiment would be to place substrate 2 in pallet 1 with IC 3 located above the substrate. In either configuration, the plurality of solder connection points 4 attaching IC 3 to substrate 2 are also shown in FIG. 2 and are typically C4 solder balls.

The depth of pallet cavity 7 is formed such that when substrate 2 and IC 3 are placed inside cavity 7 in pallet 1, there is an IC space 11 below IC 3. IC space 11 between the surface of IC 3 and pallet 1, in a preferred embodiment is approximately 0.015 inches, although in other operating embodiments of the inventive apparatus IC space 11 could be in the range of 0.001 to 0.10 inches.

Figure 3:
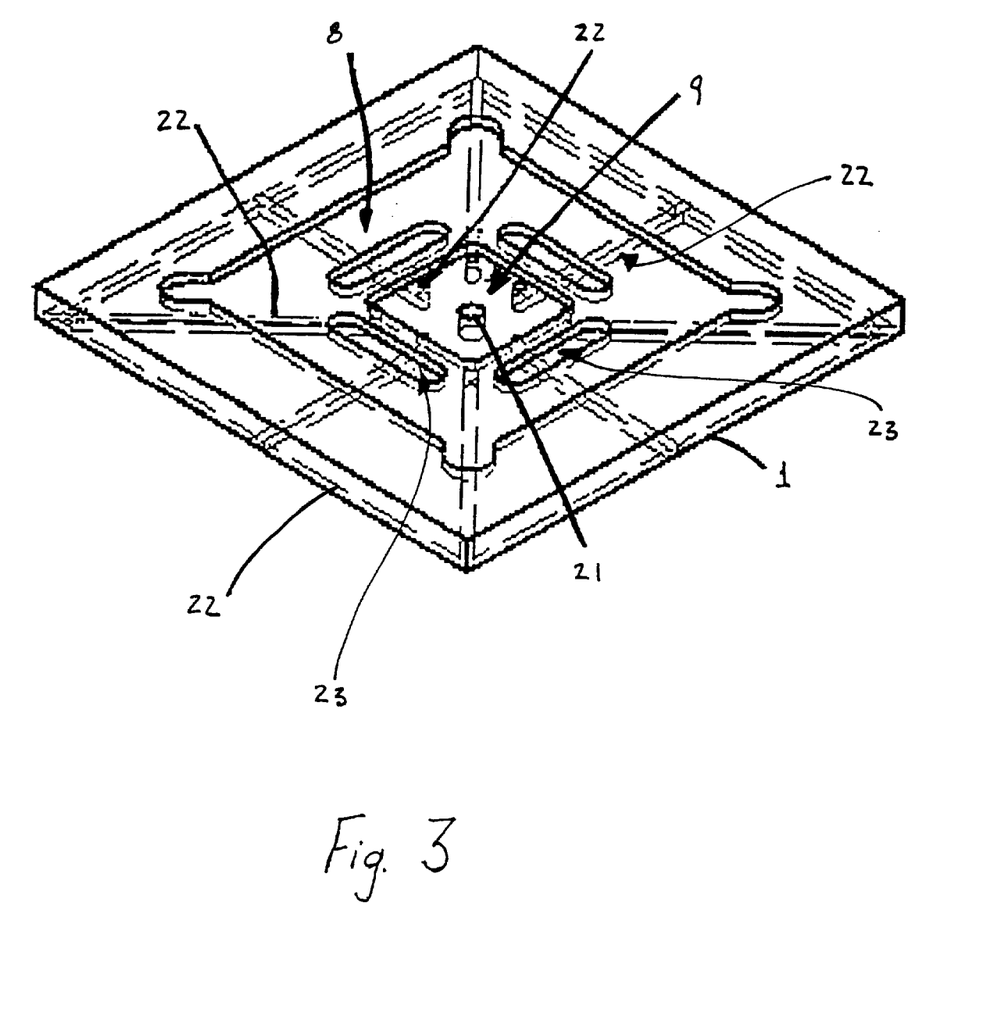
FIG. 3 shows an isometric cut-away view of an exemplary embodiment of the vented pallet to hold the substrate and integrated circuit.

FIG. 3 provides greater detail of a preferred embodiment of pallet 1 having several ports and vents to improve the flow of air into and through pallet 1. First, centered in IC cutout 9 and extending through pallet 1 is vacuum port 21. Port 21 is the source of the vacuum used to draw air out of IC cutout 9, thereby creating a vacuum on the IC surface and drawing the IC away from the substrate. Located around IC cutout 9 are a plurality of vent channels 22 and vent slots 23. The design of vent channels 22 and vent slots, including the location, dimensions and intercommunication, is directed to improving the flow of air through IC cutout 9 to remove the IC from the substrate. In the preferred embodiment shown in FIG. 3, vent slots 23 may be machined in substrate cutout 8 adjacent to each side of IC cutout 9. Vent slots 23 extend through pallet 1 and communicate with channels 22 (shown in shadow lining) formed along the bottom of, the perimeter of, and diagonally across pallet 1. As also shown in FIG. 3, certain radial channels 22 may extend to and communicate with IC cutout 9. Although pallet 1 is shown in FIG. 3 with bottom venting channels 22, other preferred embodiments of pallet 1 may be effectively used having only vacuum port 21 and no bottom channels 22 communicating with IC cutout 9.

The design of venting channels 22 and vent slots 23 is to ensure that sufficient air may be drawn into cavity 9 as the vacuum is applied. Moreover, because the pallet is on heater plate 15, air within venting channels 22 and vent slots 23 is also heated. The advantage of pulling heated air from venting channels 22 into cavity 7 is that the solder connection points 4 will not solidify due to cool air being drawn through cavity 7. That is, once solder connection points 4 reach reflow status, it is desired that they remain in such a state when the vacuum is applied to pull the IC from the substrate.

The known good die removal apparatus 10, as shown in one preferred embodiment in FIG. 1A, includes in addition to pallet 1, substrate 2 and IC 3, heater block 15, vacuum port 14, chiller block 16 and vacuum source 19. The first step of the inventive IC removal method is to place substrate 2 and IC 3 into pallet 1. As shown in FIG. 2, while the face of substrate 2 rests on the surface of pallet 1 in substrate cutout 8, there is a narrow clearance or IC space 11 between IC 3 and the surface of IC cutout 9. Next, the pallet/substrate/IC combination is placed on heating plate 15. Through heat transfer, the temperature of pallet 1, substrate 2, IC 3 and solder connection points 4 are increased.

Located in heating plate 15 is a vacuum port 14. For correct application of the vacuum force to the IC, pallet 1 must be placed or moved onto heating plate 15 such that vacuum port 14 aligns with pallet vacuum port 21.

After the pallet/substrate/IC combination unit is appropriately located on heating plate 15, with vacuum port 14 located in line with pallet vacuum port 21, and after the temperature of solder connection points 4 reach a reflow state, a vacuum source 19 is activated. The forming of a vacuum below and within IC cutout 9 pulls air through vacuum port 14, pallet vacuum port 21, and through IC space 11. The flow of air through these ports and IC space 11 creates a low pressure zone in IC space 11 and below IC 3. As the vacuum forces increase, and the surface pressure on the face of IC 3 decreases below the surface pressure on the C4 side of IC 3 and the solder connection points 4 surface tension forces. When the pressure on the face of IC 3 is less than the combined pressure on the C4 side of IC 3 with the surface tension forces from the solder connection points 4, IC 3 is pulled away from substrate 2. It is important to note that even though the IC is, in the embodiment shown in FIG. 2, below the substrate, and the C4s are in a reflow state, due to surface tension of the C4 solder connections, the IC will not separate without being pulled away by a force. Finally, after IC 3 is removed from substrate 2, pallet 1 with the separate substrate 2 and IC 3 may be moved to a chiller block 16.

Accordingly, IC 3 is removed from substrate 2 without either element being mechanically grasped, clamped or secured. Through the use of fluidics, the IC may be separated from the substrate in a non-destruction manner. Moreover, in another preferred embodiment of the present inventive method and apparatus, not shown in the figures, fluidics or a vacuum may be applied to both IC 3 and substrate 2 to pull the two components away from each other.

Once IC 3 is separated from substrate 2, the vacuum source 19 may be shut off. As shown in FIG. 2, in a preferred embodiment of the present invention, a sensor 18 may be incorporated in the vacuum source line to automatically disable the vacuum when IC 3 is released. Because the released IC 3 closes pallet vacuum port 21 and vacuum port 14, the pressure within the vacuum source line increases when IC 3 has been removed. As such, with sensor 18, the vacuum may be automatically shut off when IC 3 has been successfully removed from substrate 2. Alternatively, a simple switch 17 may be incorporated to manually shut the vacuum off after IC 3 is removed.

As shown in FIGS. 1A and 1B, the process of removing ICs from substrates may be mechanized or automated to increase the through-put of the removal operations. The devices illustrated in FIGS. 1A and 1B show the placement of a series of pallets/substrates with attached ICs on heating plate 15. The placement and movement of pallets can be accomplished through an indexing system or by a conveyor belt mechanism. Such an indexing system or conveyor belt may also be automatically or computer controlled.

FIG. 1B shows a first pallet/substrate/IC unit 30 on a feed nest 33. A second and third pallet/substrate/IC unit are shown ready to be loaded on the feed nest 33. An indexing feed element 34 pushes the first unit 30 onto heating plate 15. Once unit 30 is on the heating plate, the temperature of the pallet/substrate/IC and solder connection points 4 begins to increase. Next, the second unit 32 is placed onto, or moved onto feed nest 33 behind the first unit 30. As indexing feed element 34 pushes the second unit 31 onto heating plate 15, second unit 31 in turn pushes the first unit further along heating plate 15. In succession, additional pallet/substrate/IC units are then placed onto feed nest 33 and moved onto heating plate 15 by indexing feed element 34. Each time another unit is moved onto the heating plate, it in turn moves the preceding units along heating plate 15.

As shown in FIG. 1A, as the third unit is indexed on heating plate 15, the first unit is moved along heating plate 15 to be aligned with vacuum port 14. By appropriately setting the timing of the indexing of the units onto heating plate 15, by the time the first unit 30 is aligned over vacuum port 14, the solder connection points 4 attaching the IC and substrate in that unit have reached reflow temperature. Once the unit is aligned over the vacuum port, a vacuum is applied as described above and the IC is pulled away from its substrate. As disclosed above, once the IC is separated from the substrate, the vacuum is shut off and the next pallet/substrate/IC unit may be indexed into place. The indexing of the next unit over vacuum port 14 pushes the preceding unit onto chiller block 16 and with successive indexed movements onto an exit tray 28. Once in exit tray 28, the substrate and IC may be removed from the pallet for rework or other TCA uses. The pallet 1 may then be reused for additional substrates and ICs.

Because the C4 solder connection points may experience effects of oxidation during the heating process, the heating elements of removal apparatus 10 may be enclosed in a cover 25, as shown in dashed lines in FIG. 1B. Within the covered removal apparatus an oxygen reduced environment may be maintained. In other preferred embodiments, the oxygen reduced environment may through the use of a nitrogen enriched gas or a forming gas. Cover 25 has an entrance door 26 and an exit door 27 to help maintain the desired oxygen reduced environment around the heating elements of the removal apparatus 10.

In another preferred embodiment of the inventive removal methods and apparatus, selective ICs that are attached to a single substrate may be removed. Indeed, the inventive hot vac method may be the only practical way of removing one or more ICs from a substrate in a non-destructive manner. More specifically, if multiple ICs are attached to a single substrate, the clearances between the ICs are often very limited. It has been noted that with the continuing need for smaller and faster electronics devices, the density of components and ICs fabricated on a substrate has significantly increased. In view of the very close proximity of ICs in a multi-IC substrate, it may be impossible to remove selective ICs through the use of mechanical grasping or a hot shear device.

Figure 4:
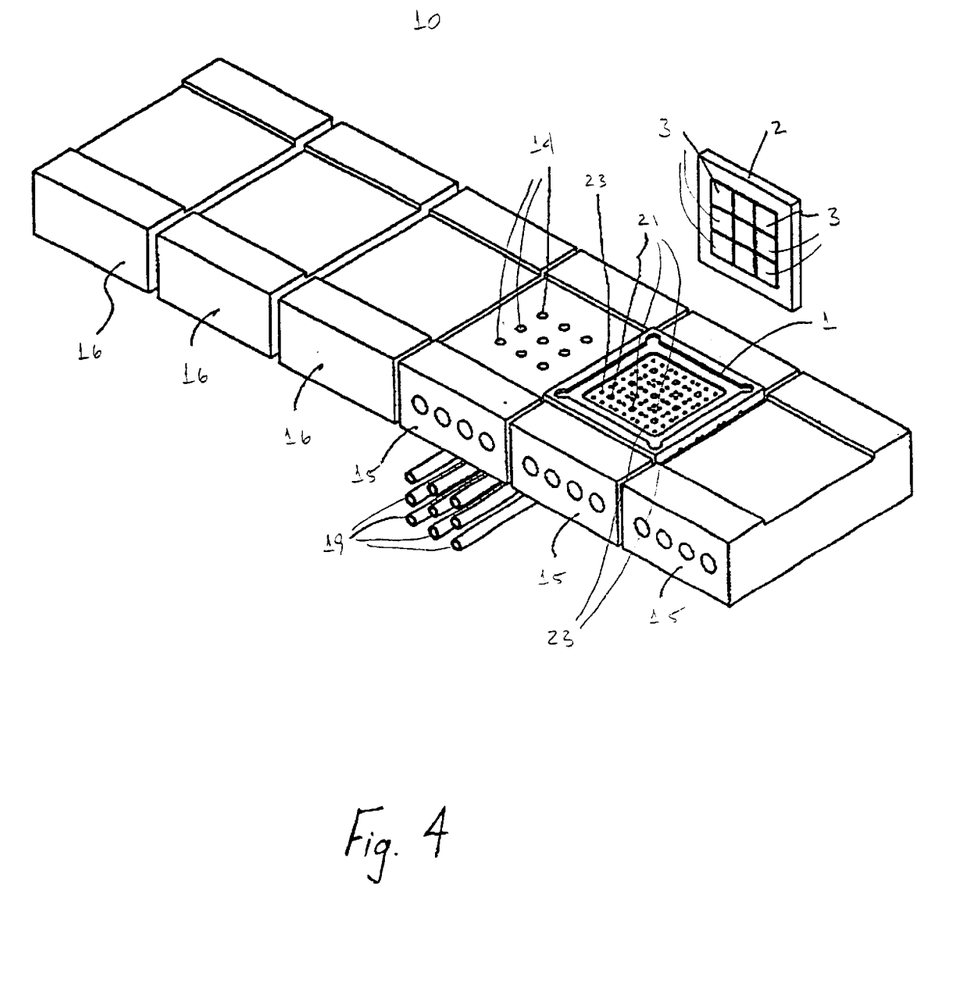
FIG. 4 shows an isometric view of an exemplary embodiment of the inventive apparatus having multiple vacuum leads for removing one or more integrated circuits from a substrate where multiple integrated circuits are attached to the substrate.

FIG. 4 shows an inventive removal apparatus 10, similar to the removal apparatus 10 in FIGS. 1A and 1B, that is designed to selectively remove any one or more of nine ICs 3 attached to substrate 2. In this embodiment, a series of heater plates 15 set at different temperatures to allow the slow controlled heating of the pallet/substrate/IC units as the units are indexed along the heater plates 15. When a pallet/substrate/IC unit is aligned over the heating plate 15 with the multiple vacuum ports 14, the solder connection points will have achieved reflow temperature. At this point, one or more of the vacuums may be applied to the aligned ICs 3 through vacuum ports 14 to pull an IC or multiple ICs from substrate 1. Once the desired ICs are separated from substrate 1, the next pallet/substrate/IC unit may be indexed into alignment with the vacuum ports 14, which in turn indexes the preceding unit onto the first of a series of chiller plates 16. For the embodiment illustrated in FIG. 4, multiple chiller plates 16 are used, with each successive plate 16 being set at a lower temperature to allow the pallet/substrate and separated IC to be cooled down at a controlled rate.

Through use of vacuum control switches, not shown in FIG. 4, incorporated into the multiple vacuum lines 19, selective application of vacuum forces can be applied to one or more IC 3 attached to substrate 2. Accordingly, through the use of the inventive method and apparatus, one or more, or all ICs 3 attached to a substrate may be removed from the substrate without the use of mechanical prying, grasping or securing of the IC or substrate.

There may be applications where the use of a pure "hot vac" method of IC removal is impractical. For example, the bringing of a substrate and IC package to reflow temperature and the subsequent removal of an IC from the substrate may cause damage to other ICs or components on the substrate if solder connections not associated with the removed IC are to be effected. For such applications and substrates, a combined "hot vac/hot shear" method and apparatus that does not raise the solder connection points to a reflow condition could be effectively used to remove an IC without causing damage to other components on the substrate.

Figure 5:
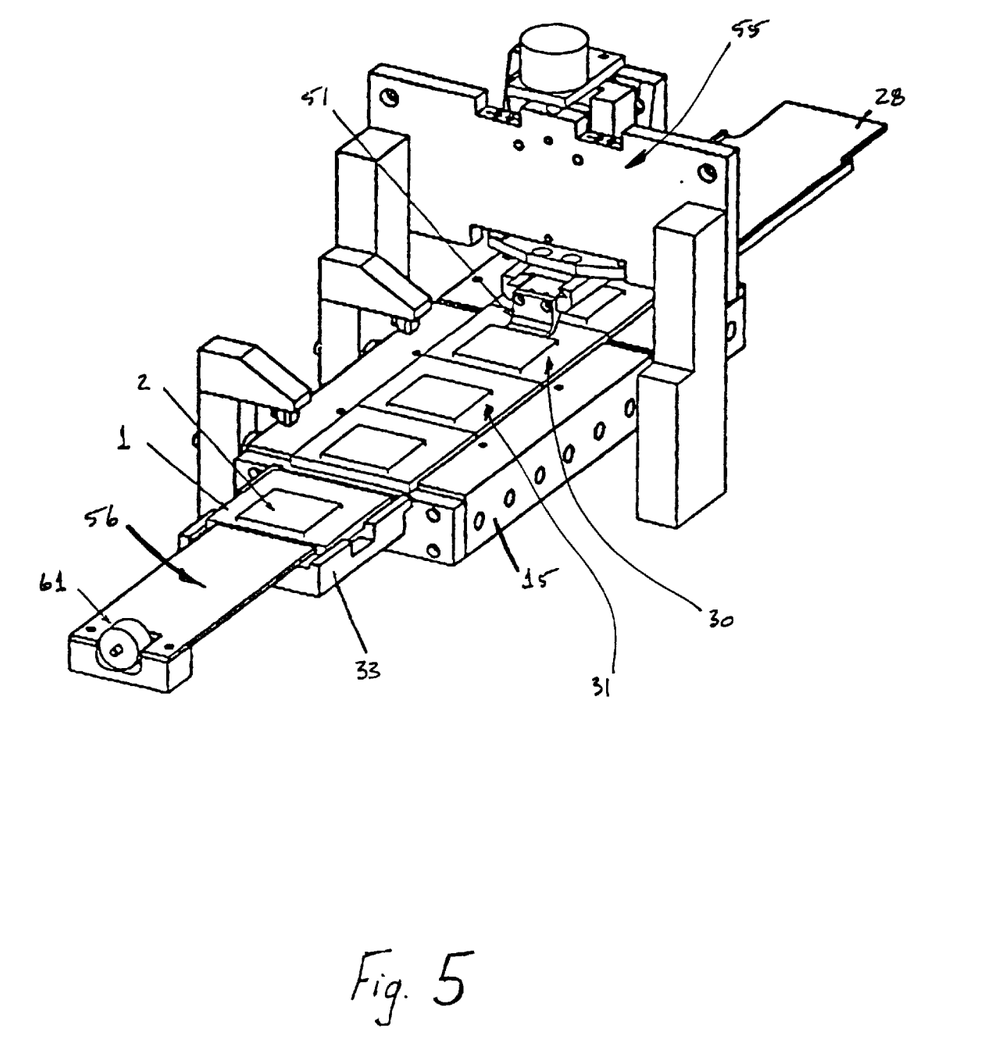
FIG. 5 shows an isometric view of an exemplary embodiment of the inventive apparatus using a vacuum pulling force and a physical shear force to remove an integrated circuit from a substrate.
Figure 6:
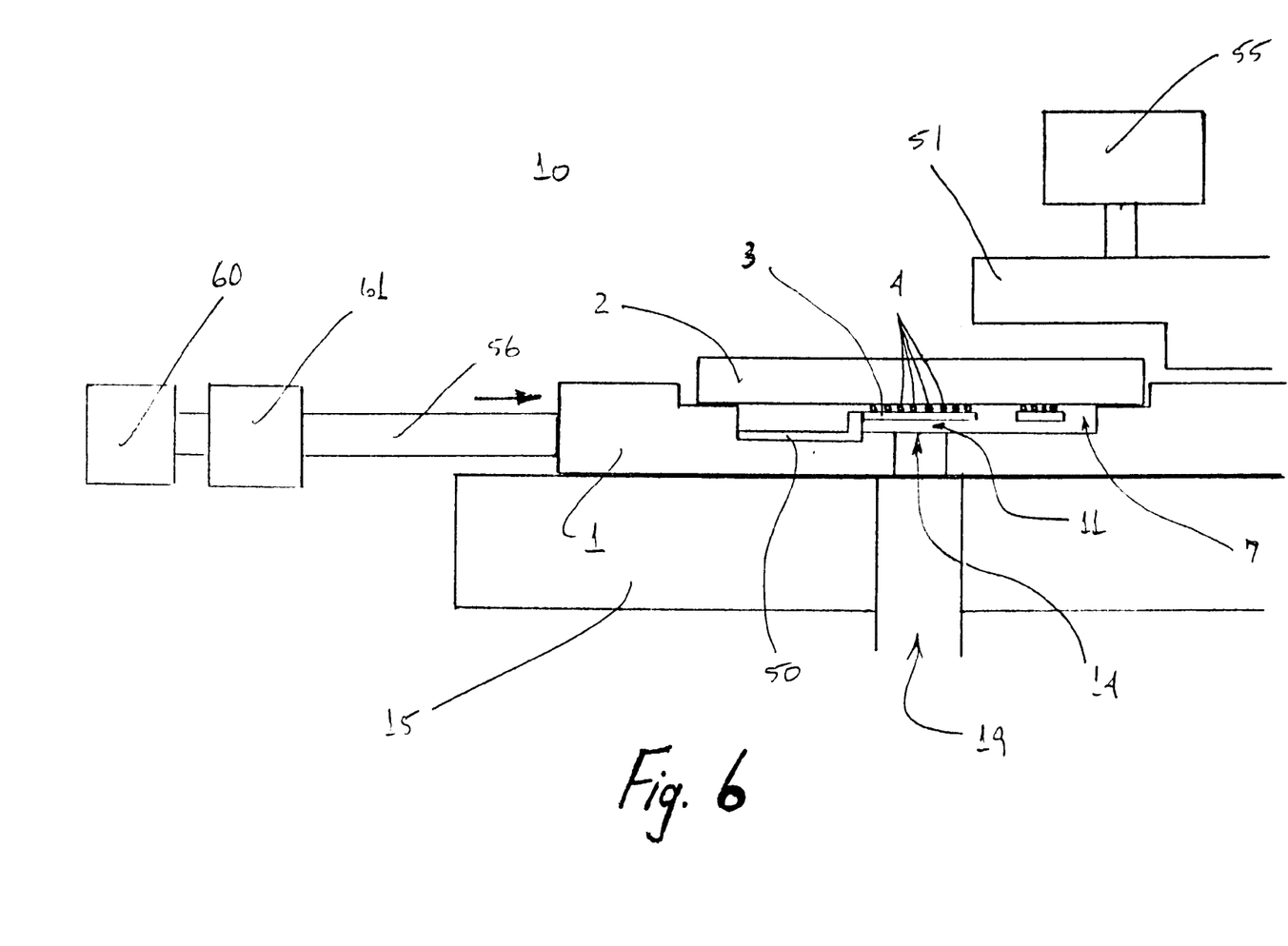
FIG. 6 shows a cut-away side view of an exemplary embodiment of the inventive apparatus for removing an integrated circuit from a substrate using a shear force in conjunction with a vacuum force.

As shown in FIGS. 5 and 6, a preferred embodiment of the inventive apparatus using the inventive method of a combined hot vac/hot shear is illustrated. Referring first to FIG. 6, the apparatus has several elements and components similar to the pure hot vac embodiment shown in FIG. 2. More specifically, the combined apparatus uses a pallet 1, into which the substrate 2 with attached IC 3 is placed. The pallet 1 has a machined cavity 7 into which the substrate 2 and IC 3 appropriately fit. Pallet 1 also has a vacuum port 14 aligned under IC 3. Specific to the hot vac/hot shear apparatus 10, pallet 1 incorporates a shear blade 50 that is embedded into the pallet. The structure and placement of shear blade 50 is such that when the substrate 2 and IC 3 are placed into pallet cavity 7, IC 3 is in close proximity to shear blade 50 as illustrated in FIG. 6. The combined hot vac/hot shear apparatus 10 also has a heating plate 15 with vacuum source 19 similar to the hot shear embodiment described above.

Unlike the above hot shear embodiment, the combined hot vac/hot shear apparatus 10 also uses a computer controlled servo-motor 60 and load cell 61 to apply a drive force to a drive blade 56. As shown in FIG. 6, servo-motor 60, through load cell 61 translates drive blade 56 to the right, which in turn translates pallet 1, substrate 2 and IC 3 to the right. Finally, a shear block 51 is positioned above pallet 1. Shear block is fixed in position in the horizontal direction, or as illustrated in FIG. 6, shear block 51 has no degree of freedom to move to the left or right. However, in a preferred embodiment, and as shown in FIG. 6, shear block 51 is vertically movable by a lift unit 55.

In operation, the combined hot vac/hot shear apparatus 10 first requires that substrate 2 with attached IC 3 be placed into pallet cavity 7 such that IC 3 is close to or touching shear blade 50. Pallet 1 is next placed on heating plate 15 to raise the temperature of pallet 1 and in turn the temperature of substrate 2, IC 3 and solder connection points 4. However, unlike the pure hot vac apparatus embodiment described above, the heating plate does not raise the temperature of the C4 connection points to a reflow temperature. In this embodiment, the temperature of the connection points 4 preferably should be below reflow temperature. For reference, C4 solder ball reflow temperature is approximately 310° C. to 320° C. In a preferred embodiment of the combined hot vac/hot shear apparatus and method, the temperature of the solder connection points 4 is raised to approximately 260° C.

Once pallet 1, substrate 2, IC 3 and solder connection points 4 reach the desired temperature, servo-motor 60 through load cell 61 forces drive blade 56 to translate pallet 1 towards shear block 51. As shown in FIG. 6, shear block 51 is position above pallet 1, but in a position that will impact substrate 2 as substrate 2 moves to the right. Once substrate 2 reaches shear block 51, substrate 2 stops moving to the right. As drive blade continues to move pallet 1 to the right, shear blade 50 moves IC 3 to the right, thereby separating IC 3 from substrate 2. When pallet 1 is moved into position where substrate 2 reaches shear block 51, vacuum port 14 in pallet 1 is aligned with vacuum source 19. At this time, a vacuum force is applied through vacuum port 14 to IC 3, similar to the above described hot vac embodiment. Accordingly, as shear blade 50 moves IC 3, imparting a shear force to IC 3, there is also a vacuum force pulling IC 3 away from substrate 2.

The servo-motor 60 and load cell 61 precisely control the force and translation of pallet 1 into shear block 51 to ensure neither the substrate 2 of IC 3 are damaged by impact forces. In a preferred embodiment, during the final 0.01" translation of drive blade 56 and pallet 1, the speed of drive blade 56 is reduced to slowly move pallet 1, in turn move substrate 2 into shear block 51, and further in turn move shear blade into IC 3. The application of a vacuum force to IC 3 assists in separating IC 3 from substrate 2 in a non-destructive manner and assists in catching IC 3 in pallet 1 without IC 3 being thrown around cavity 7 after release from substrate 2.

Similar to the above FIGS. 1A and 1B embodiments, the hot vac/hot shear apparatus and method may be mechanized or automated to reduce operator time and input and to increase through-put of IC removal operations. As shown in FIG. 5, a series of pallets/substrates/ICs may be placed and indexed on heating plate 15. The movement of the pallets may be by an indexing system, either manually or automatically controlled. Four pallet/substrate/IC units are shown in FIG. 5 with the first unit 30 in place below shear block 51 and the last unit in place on the load nest 33.

In the FIG. 5 embodiment, after the IC is separated from the substrate, the lift mechanism 55 raises shear block 51, and the servo-motor forces drive blade 56 to move the pallet/substrate/IC units forward thereby pushing unit 30 onto a cooling plate and exit tray 28. Once unit 30 is clear of shear block 51, lift mechanism 55 lowers shear block 51 to be in position above the pallet and to prevent the substrate of unit 31 from moving to the right. In succession, additional pallets/substrates/ICs are placed onto feed nest 33 and moved onto heating plate 15. As noted, the FIG. 5 apparatus may be mechanized or automatically controlled to increase the number IC separations that may be achieved.

An important aspect of this embodiment of the present invention is the ability to pre-program the force characteristics of the servo motor. This aspect of the present invention is useful to potentially match desired force profiles for shearing an IC from a substrate. Indeed, the force characteristics required to shear an IC from a substrate (a) as a function of differential distance moved by the substrate or IC, (b) as a function of speed of the shear element, and (c) as a function of temperature of the solder connection points may be different for varied IC/substrate units. There may be particular force profiles or characteristics which result in limited or no damage to the IC, substrate or C4s.

Figure 7:
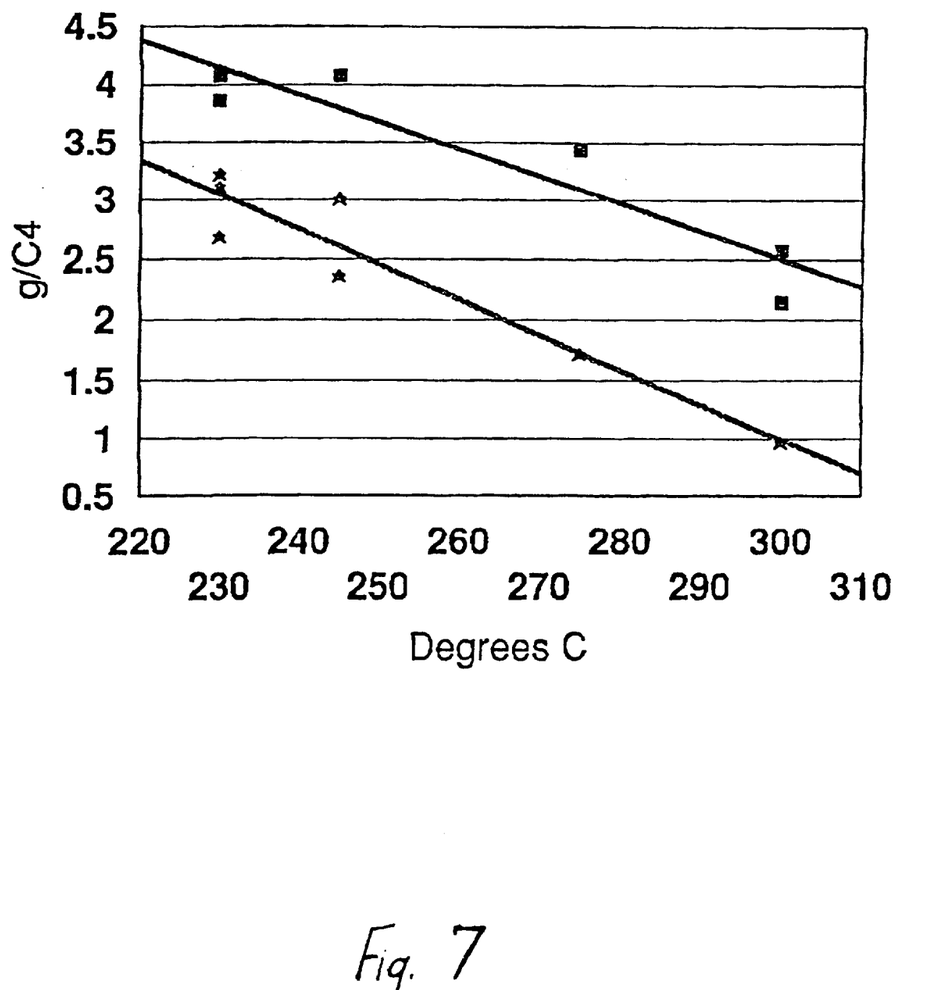
FIG. 7 shows a graph of force density required to remove an integrated circuit from a substrate versus temperature of the substrate.
Figure 8:
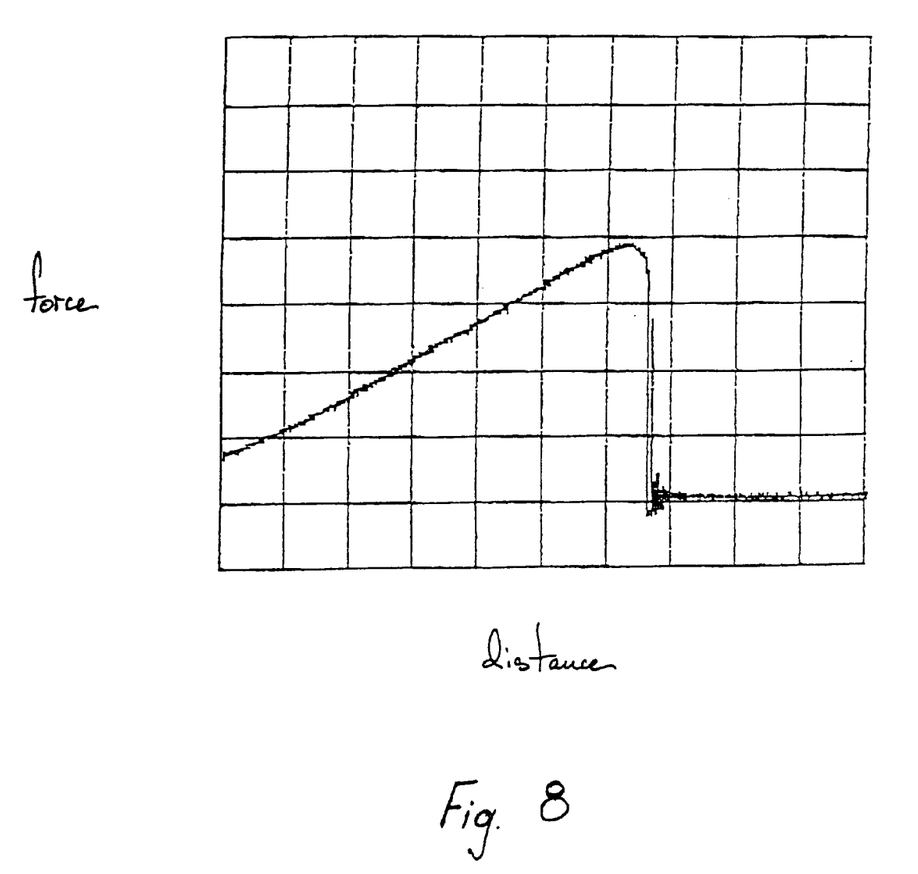
FIG. 8 shows a graph of actual force to move an integrated circuit as a function of differential distance between the integrated circuit and the substrate.

FIG. 7, for example, shows the force per C4 solder point data as a function of temperature for two shear element speeds. As expected, the force required to remove an IC from a substrate decreases as the temperature of the solder points increases. Similarly, FIG. 8 shows the actual measured force by a load cell 61, as illustrated in FIGS. 5 and 6, and shown on an oscilloscope (not shown). The force characteristics in the FIG. 8 graph show the force to move drive blade 56, and in turn the pallet/IC, at a constant speed as a function of distance of the pallet/IC in relation to a fixed substrate. As shown, the force to move the IC increases until the C4 retention forces release and the IC separates from the substrate.

Because the present inventive hot vac/hot shear apparatus and method uses a computer controlled servo-motor and a load cell, in a preferred embodiment, the present invention provides the means for a feedback control system using a force feedback signal from the load cell to control the servo-motor. This type of closed-loop feedback control system allows computer or machine monitoring and control of the force imparted to the pallet by the servo-motor. Through this feedback mechanism, monitoring and control of the force imparted to the substrate and IC as a function of time or distance in order to separate the two components is available. Accordingly, the present invention, with the use of the servo-motor and load cell, provides a means of precisely matching desired force characteristics for a particular substrate/IC unit as a function of temperature, time and/or distance as shown in FIGS. 7 and 8.

Although the invention has been described with reference to exemplary embodiments, it is not limited thereto. It is intended to be and understood that the following appended claims should be construed to include other variants and embodiments of the invention which may be made by those skilled in the art as being within the true spirit and scope of the present invention.

What is claimed is:

1. An apparatus for removing an integrated circuit from a substrate where said integrated circuit is attached to said substrate by a plurality of solder connection points, comprising:

a pallet having a cavity into which the substrate and integrated circuit fit, said pallet having a plurality of air channels formed in said pallet;

a heating plate, onto which the pallet, substrate and integrated circuit are placed to increase the temperature of the plurality of solder connection points to a reflow temperature; and fluidic pulling means applied to the integrated circuit through the pallet plurality of air channels to remove the integrated circuit from the substrate after the plurality of solder connection points achieve a reflow temperature, said fluidic pulling means also maintaining the integrated circuit in the pallet cavity.

2. The apparatus for removing an integrated circuit from a substrate as provided in claim 1, wherein the pulling means is a vacuum applied to the integrated circuit through the pallet plurality of air channels.

3. The apparatus for removing an integrated circuit from a substrate as provided in claim 1, wherein the pulling means is a vacuum applied to both the substrate and the integrated circuit.

4. The apparatus for removing an integrated circuit from a substrate as provided in claim 1, further comprising a vacuum switch to shut off the vacuum upon release of the integrated circuit from the substrate.

5. The apparatus for removing an integrated circuit from a substrate as provided in claim 1, further comprising at least one sensor to shut off the vacuum upon release of the integrated circuit from the substrate.

6. The apparatus for removing an integrated circuit from a substrate as provided in claim 5, wherein the at least one sensor is a pressure sensor monitoring increases in vacuum pressure.

7. The apparatus for removing an integrated circuit from a substrate as provided in claim 1, further comprising a switch to shut off the heating plate upon release of the integrated circuit from the substrate.

8. The apparatus for removing an integrated circuit from a substrate as provided in claim 1, further comprising automatic operation of the pulling means as a plurality of pallets, substrates and integrated circuits are indexed through the apparatus.

9. The apparatus for removing an integrated circuit from a substrate as provided in claim 8, further comprising automatic operation of the indexing of the plurality of pallets, substrates and integrated circuits through the apparatus.

10. The apparatus for removing an integrated circuit from a substrate as provided in claim 1, wherein the pallet has a plurality of cavities into which the substrate and a plurality of integrated circuits fit.

11. The apparatus for removing an integrated circuit from a substrate as provided in claim 10 further comprising a plurality of pulling means each individually directed to the plurality of pallet cavities.

12. The apparatus for removing an integrated circuit from a substrate as provided in claim 10, further comprising a plurality of switches to individually control the plurality of pulling means.

13. The apparatus for removing an integrated circuit from a substrate as provided in claim 1, further comprising a cover to maintain the heating plate and pulling means in an oxygen reduced environment.

14. The apparatus for removing an integrated circuit from a substrate as provided in claim 1, further comprising a cover to maintain the heating plate and pulling means in a nitrogen enriched environment.

* * * * *